(12) United States Patent
Abe et al.

(10) Patent No.: US 7,301,176 B2
(45) Date of Patent: Nov. 27, 2007

(54) SEMICONDUCTOR LIGHT EMITTING DEVICE AND FABRICATION METHOD THEREOF

(75) Inventors: Munezo Abe, Shiki-gun (JP); Toshihiko Yoshida, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 61 days.

(21) Appl. No.: 11/112,215

(22) Filed: Apr. 22, 2005

(65) Prior Publication Data

US 2005/0236639 A1    Oct. 27, 2005

(30) Foreign Application Priority Data

Apr. 27, 2004    (JP) .............................. 2004-131774

(51) Int. Cl.
*H01L 29/22* (2006.01)
*H01L 33/00* (2006.01)
*H01L 23/495* (2006.01)

(52) U.S. Cl. .................. 257/98; 257/99; 257/100; 257/666; 257/432; 257/E25.032

(58) Field of Classification Search .......... 257/98–100, 257/666, 432, E25.032
See application file for complete search history.

(56) References Cited

U.S. PATENT DOCUMENTS 3,780,357 A * 12/1973 Haitz .......................... 257/100
6,051,848 A * 4/2000 Webb ........................... 257/99
6,653,661 B2 * 11/2003 Okazaki ....................... 257/98
7,078,734 B2 * 7/2006 Hiramoto ..................... 257/98
7,088,038 B2 * 8/2006 Srivastava et al. ........... 313/501
2004/0084687 A1 * 5/2004 Hohn et al. .................. 257/100

FOREIGN PATENT DOCUMENTS

| JP | 06-334224 | 12/1994 |
| JP | 11-087780 | 3/1999 |
| JP | 2001-185763 | 7/2001 |

\* cited by examiner

*Primary Examiner*—Nitin Parekh
(74) *Attorney, Agent, or Firm*—Morrison & Foerster LLP

(57) ABSTRACT

A semiconductor light emitting device includes an LED element, a lead frame on which the LED is mounted, a lead frame electrically connected to the LED element via a wire, transparent resin formed on the LED element and on the lead frames, and light shielding resin having a reflectance higher than the reflectance of the transparent resin, surrounding the perimeter of the LED. The transparent resin includes a lens portion constituting a lens on the LED, and a holding portion holding the lead frame.

7 Claims, 4 Drawing Sheets

SEMICONDUCTOR LIGHT EMITTING DEVICE AND FABRICATION METHOD THEREOF

This nonprovisional application is based on Japanese Patent Application No. 2004-131774 filed with the Japan Patent Office on Apr. 27, 2004, the entire contents of which are hereby incorporated by reference.

BACKGROUND OF THE INVENTION

1. Field of the Invention

The present invention relates to a semiconductor light emitting device, and a method of fabricating such a semiconductor light emitting device. Particularly, the present invention relates to a semiconductor light emitting device employing a light emitting element such as an LED (Light Emitting Diode), and a method of fabricating such a semiconductor light emitting device.

2. Description of the Background Art

Semiconductor light emitting devices employing a light emitting element such as an LED are conventionally known.

For example, Japanese Patent Laying-Open No. 11-087780 (first conventional example) discloses a light emitting device including a light emitting element, a lead frame on which the light emitting element is to be mounted, a lead frame for electrical connection to the light emitting element via a wire, and a molding covering most of the lead frames. Respective lead frames are arranged opposite to each other, passing through the molding to project outside.

Japanese Patent Laying-Open No. 2001-185763 (second conventional example) discloses an optical semiconductor package including an optical semiconductor element, a lead frame on which the optical semiconductor element is to be mounted on the main surface, a first resin molding (lens) formed of light shielding resin, arranged so as to cover the optical semiconductor element, and a second resin molding (case) formed of light transmitting resin with a bottom supporting the inner lead of the lead frame and a side supporting the first resin molding. The lead frame is formed such that the region at the back side of the lead frame corresponding to the region where the optical semiconductor element is mounted penetrates the bottom of the second resin molding to be exposed outside, constituting a first heat dissipation region, and an outer lead portion constitutes a second heat dissipation region.

Japanese Patent Laying-Open No. 06-334224 (third conventional example) discloses a fabrication method of an LED light emitting device including the steps of attaching an LED chip to a printed board, arranging a pair of molds with respect to the printed board, and introducing synthetic resin for molding from a predetermined position that does not have an adverse effect on the lens characteristics in the mold located at the LED chip mounting face. The printed board has a through hole near the LED chip.

Problems of such semiconductor light emitting devices will be described hereinafter.

If the semiconductor light emitting element in the first conventional example becomes thinner, the depth of the bowl-like concave formed by the molding will be reduced, leading to a wider angle of radiation of the output light. There is a possibility of the adjustment of the directivity being partially degraded when the light emitting element is reduced in size.

The light emitting devices of the second and third conventional examples have a lens formed of transparent resin on a printed board or lead frame. Accordingly, the angle of radiation of the output light can be reduced to improve the axial luminous intensity.

When a lens is to be formed as in the second and third conventional examples, the height of the lens must be ensured such that the light emitting element (LED chip) and wire are covered. As a result, there are cases where reduction in the size of the light emitting element is restricted.

In the second conventional example, the lead frame is secured by the second resin molding. To ensure the strength of security, the second resin molding is made relatively large. As a result, there are cases where reduction in size of the light emitting element is restricted. It is to be noted that the third conventional example is silent about the concept of employing a lead frame.

SUMMARY OF THE INVENTION

An object of the present invention is to provide a semiconductor light emitting device having a light emitting element mounted on a lead frame, directed to reducing the size thereof while allowing adjustment of the directivity of output light, or ensuring the strength of the lead frame, and a fabrication method of such a semiconductor light emitting device.

According to an aspect of the present invention, a semiconductor light emitting device includes a semiconductor light emitting element, a first lead frame on which the semiconductor light emitting element is mounted, a second lead frame electrically connected with the semiconductor light emitting element via a wire, and a light transmitting resin formed on the semiconductor light emitting element and on the first and second lead frames. The light transmitting resin includes a lens portion constituting a lens on the semiconductor light emitting element, and a holding portion holding the first and second lead frames.

Since the semiconductor light emitting device has the first and second lead frames held by the light transmitting resin that also constitutes a lens, the device can be reduced in size while ensuring the strength of the lead frame.

The width of the lens portion is preferably smaller than the width of the holding portion.

Accordingly, the lens portion exhibits the capability of improving the axial luminous intensity whereas the holding portion exhibits the capability of fixedly holding the lead frame. By rendering the lens portion relatively smaller, the light emitting device can be reduced in size.

Preferably, the leading end of the first lead frame and the leading end of the second lead frame constitute a concave. The semiconductor light emitting element is provided on the bottom face of the concave. The holding portion receives at least a portion of the concave. Preferably, the semiconductor light emitting element is located at the concave of the first lead frame, whereas the wire establishing connection between the semiconductor light emitting element and the second lead frame is located at the concave of the second lead frame.

Accordingly, the height of the light emitting device can be reduced, allowing further reduction in size.

The semiconductor light emitting element is preferably provided on the optical axis of the lens portion.

Accordingly, the directivity can be adjusted easily.

The back side of the first lead frame corresponding to the region where the semiconductor light emitting element is mounted is preferably exposed outside of the light transmitting resin.

Accordingly, heat dissipation of the light emitting device can be improved.

Preferably, light shielding resin having a reflectance higher than that of the light transmitting resin is formed surrounding the perimeter of the semiconductor light emitting element.

By causing the output light to be reflected from the light shielding resin, directivity of the output light can be adjusted further easily.

A material for scattering light may be mixed into the light transmitting resin.

Accordingly, unevenness in the light intensity of the output light can be reduced.

A fabrication method of a semiconductor light emitting device of the present invention includes the steps of: forming light transmitting resin by insert molding, wherein the light transmitting resin holds the first and second lead frames, and constitutes a lens on the semiconductor light emitting element mounted on the first lead frame; and forming light shielding resin surrounding the perimeter of the semiconductor light emitting element using a mold provided around the semiconductor light emitting element and lens.

Accordingly, a semiconductor light emitting device directed to reducing its size while improving the axial luminous intensity or ensuring the strength of the lead frame can be obtained.

The semiconductor light emitting device of the present invention can be reduced in size while allowing adjustment of the directivity of output light or ensuring the strength of the lead frame.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Embodiments of a semiconductor light emitting device and a fabrication method thereof according to the present invention will be described hereinafter with reference to FIGS. 1-6.

Figure 5:
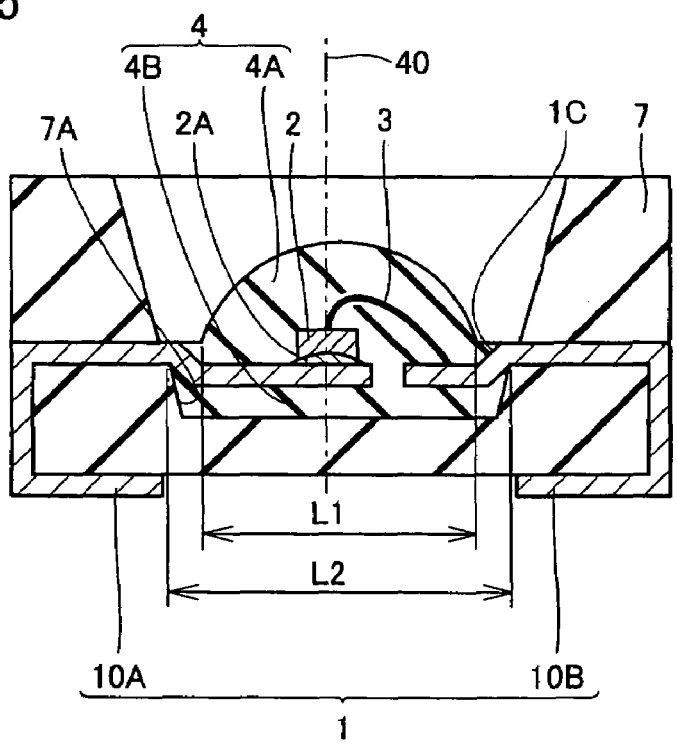
FIG. 5 is a sectional view of a semiconductor light emitting device according to an embodiment of the present invention.

Referring to FIG. 5, a semiconductor light emitting device according to an embodiment of the present invention includes an LED element 2 (semiconductor light emitting element), a lead frame 10A (first lead frame) on which LED element 2 is mounted, a lead frame 10B (second lead frame) electrically connected to LED element 2 via a wire 3, transparent resin 4 (light transmitting resin) formed on LED element 2 and lead frame 1 (10A, 10B), and light shielding resin 7 (resin that blocks light) having a reflectance higher than that of transparent resin 4, and surrounding the perimeter of LED element 2. Transparent resin 4 includes a lens portion 4A constituting a lens on LED element 2, and a holding portion 4B holding lead frame 1.

The leading end of lead frame 1 is inserted into transparent resin 4. Accordingly, transparent resin 4 fixedly holds the leading end of lead frame 1 to ensure the strength in the proximity of the leading end of lead frame 1 even in the case where light shielding resin 7 is formed relatively small. As a result, the semiconductor light emitting device can be reduced in size while ensuring the strength in the proximity of the leading end of lead frame 1.

Lens portion 4A is formed to have a shape of a convex lens. LED element 2 is formed on an optical axis 40 of lens portion 4A. Accordingly, the directivity of output light can be easily adjusted in the semiconductor light emitting device. Specifically, the axial luminous intensity of output light can be improved by lens portion 4A.

Holding portion 4B has a sectional shape of an upside-down trapezoid, received in bowl-like concave 7A of light shielding resin 7. In order to prevent disconnection between wire 3 and lead frame 10B, it is desirable that wire 3 is pressed down from above by another wire (not shown) at the connection between wire 3 and lead frame 10B, and the other end of the another wire is fixedly attached to another site of lead frame 10B. This another wire not shown is generally referred to as a "stitch wire".

In order to reduce unevenness in the light intensity of the output light, a filler for scattering light (scattering material) may be mixed into transparent resin 4.

From the standpoint of protecting lens portion 4A, the top height of light shielding resin 7 is preferably higher than the top height of lens portion 4A (for example, approximately 0.2 mm higher). Lens portion 4A has a predetermined thickness so as to cover LED element 2 and wire 3.

In the present embodiment, the leading ends of lead frames 10A and 10B constitute a concave 1C, as shown in FIG. 5. LED element 2 is provided on the bottom surface of concave 1C. The junction of wire 3 and lead frame 10B is located at concave 1C. Also, the aforementioned stitch wire is located at concave 1C. Holding portion 4B of transparent resin 4 receives at least a portion of concave 1C.

Thus, the top height of lens portion 4A is reduced together with the top height of light shielding resin 7 while ensuring a predetermined thickness of lens portion 4A and a height for lens effect (the distance from the LED element to the lens top face). As a result, the semiconductor light emitting device can be reduced in size.

LED element 2 generally provides more light from the side than from the top surface. The light output from the side of LED element 2 is reflected at the wall of concave 1C to be effectively employed as the light within the directive angle. The light arriving at holding portion 4B from the gap between lead frames 10A and 10B is reflected at the interface between holding portion 4B and light shielding resin 7 to reach lens portion 4A, where it is eventually used effectively as the light within the directive angle.

The width of lens portion 4A (L1 in FIG. 5) is smaller than the width of holding portion 4B (L2 in FIG. 5).

When the width of lens portion 4A becomes larger, a trend is towards increased thickness thereof Holding portion 4B must have a predetermined width in order to ensure the strength of lead frame 1.

By setting L1<L2 as set forth above, the strength around the leading end of lead frame 1 can be ensured while allowing a smaller semiconductor light emitting device.

Figure 1:
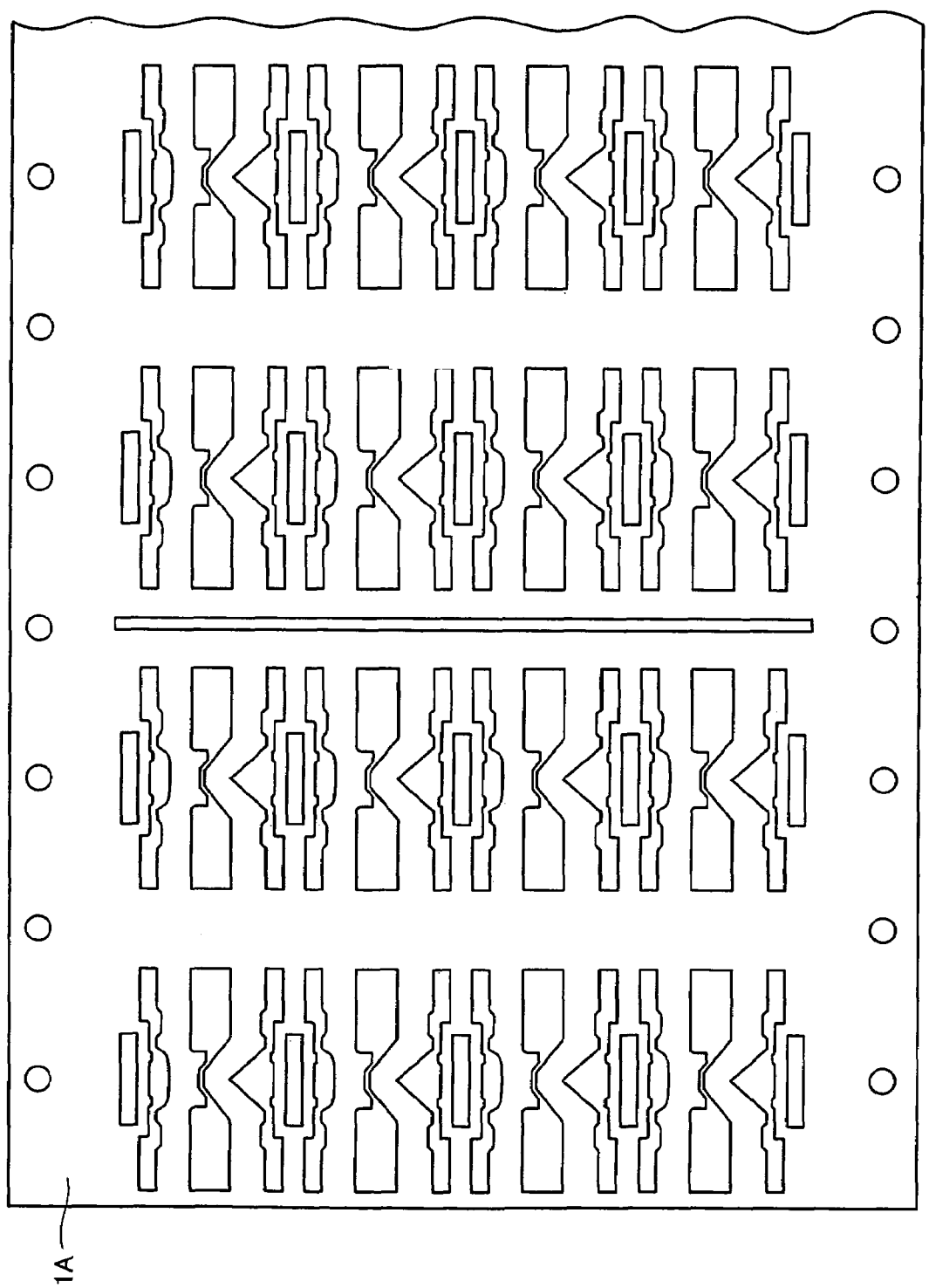
FIG. 1 is a top view of a metal plate employed in fabricating a semiconductor light emitting device according to an embodiment of the present invention.

A method of fabricating the semiconductor light emitting device of FIG. 1 will be described hereinafter. Referring to FIG. 1, a metal plate 1A employed in the fabrication of a semiconductor light emitting device is a thin metal sheet formed of copper alloy that is superior in heat conductivity. On metal plate 1A, lead frames of a plurality of elements are formed in alignment vertically and horizontally. By separating the lead frames, each individual element is obtained. A groove to separate lead frames 10A and 10B is formed by die-cutting.

Figure 2:
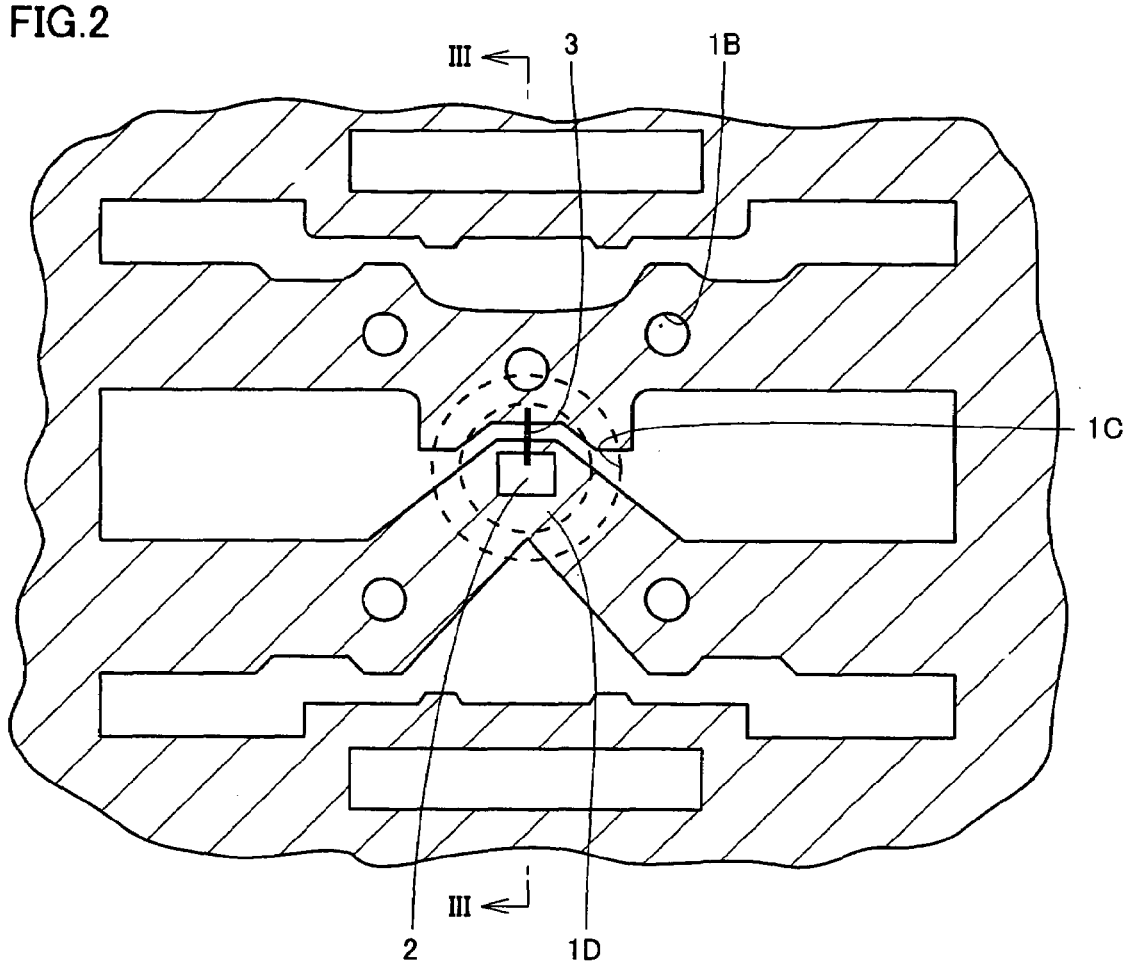
FIG. 2 is a top view of an LED element mounted on a lead frame formed from the metal plate of FIG. 1.

FIG. 2 is a top view representing LED element 2 mounted on the lead frame formed from the metal plate of FIG. 1. For the sake of convenience and simplification, the lead frame formation region is hatched in FIG. 2.

Referring to FIG. 2, LED element 2 has a quadrangle configuration in plane in which one side is at least 0.2 mm and not more than 1.0 mm. LED element 2 is located on one of the lead frames divided by a groove. Wire 3 establishes connection between LED element 2 and the other lead frame. The gap between the two lead frames is equal to or slightly smaller than the thickness of the lead frame. Since the lead frame has a thickness of at least 0.3 mm and not more than 0.5 mm, the aforementioned gap is approximately 0.25 mm. LED element 2 and wire 3 are located above bottom face 1D of concave 1C provided on the lead frame. Holes 1B are provided at the periphery of concave 1C. Hole 1B allows light shielding resin 7 formed afterwards to penetrate therethrough, suppressing the lead frame from being detached from light shielding resin 7.

Figure 3:
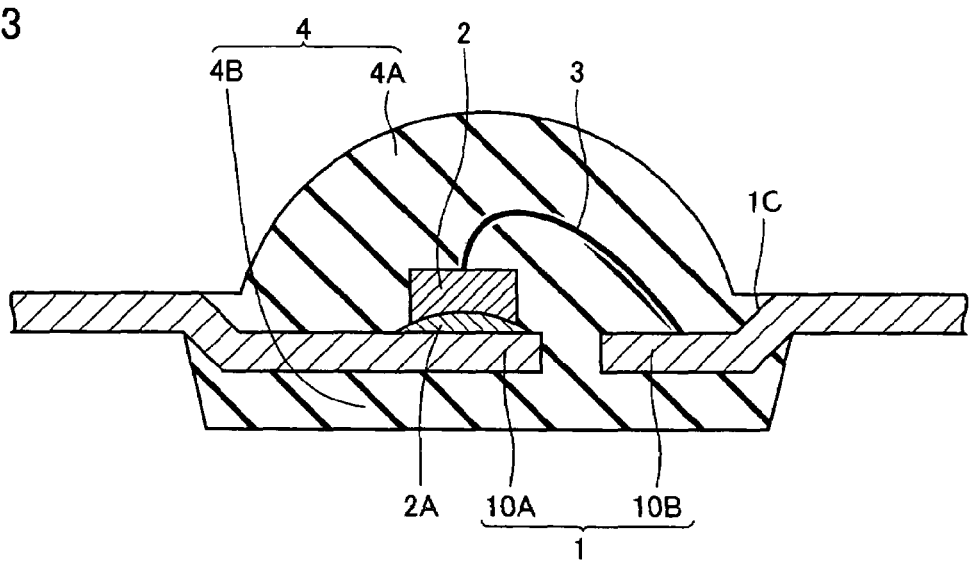
FIG. 3 is an enlarged sectional view of the neighborhood of the LED element taken along line III-III of FIG. 2.

FIG. 3 is an enlarged sectional view of the neighborhood of the LED element taken along line III-III of FIG. 2.

Referring to FIG. 3, LED element 2 is formed on lead frame 10 with Ag paste 2A thereunder. Transparent resin 4 is formed such that LED element 2 and wire 3 are covered by lens portion 4A while lead frames 10A and 10B are received at holding portion 4B. Transparent resin 4 is formed through transfer molding (insert molding). By employing transfer molding, the configuration of lens portion 4A can be worked in precision. Epoxy resin, silicon resin, or the like, for example, is employed for transparent resin 4.

Figure 4:
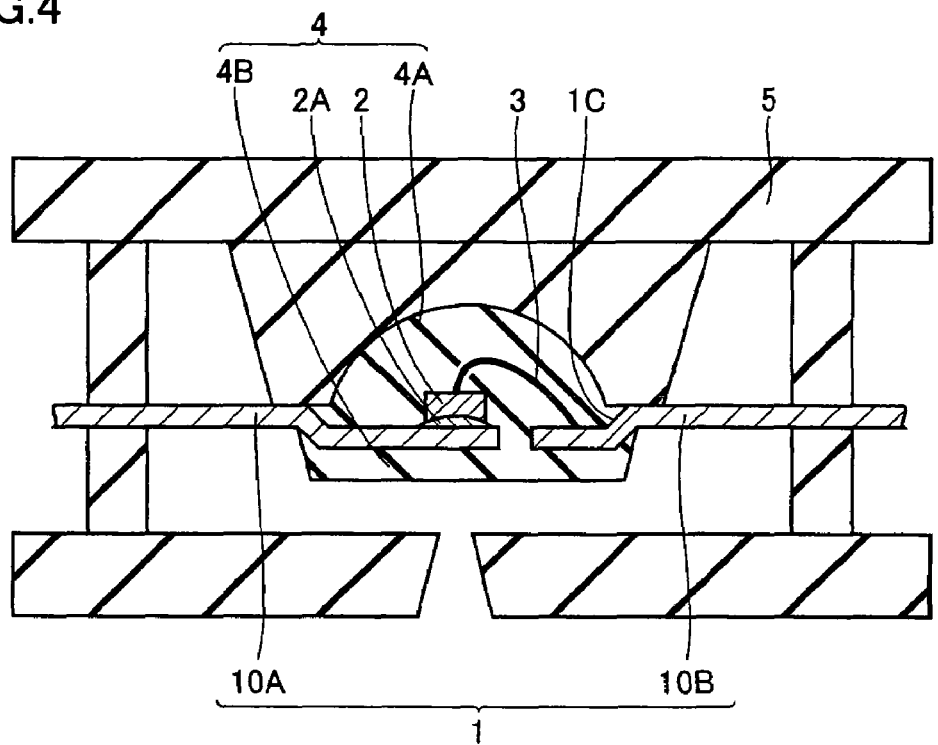
FIG. 4 is a sectional view of a mold provided to form light shielding resin at the lead frame on which an LED element is mounted.

FIG. 4 is a sectional view representing the provision of a mold 5 directed to forming light shielding resin 7 at lead frame 1 (10A, 10B) on which LED element 2 is mounted.

Referring to FIG. 4, lens portion 4A is protected by mold 5 during the formation of light shield resin 7. Light shielding resin 7 is typically applied by injection molding. The injection molding method is advantageous in that introduction of resin between lens portion 4A and mold 5 is readily suppressed since resin of low flowability is employed. Thus, damage of lens portion 4A caused by contact with resin of high temperature can be suppressed.

Light shielding resin 7 is formed so as to cover the bottom surface and side surface of transparent resin 4. Resin of high reflectance with respect to visible light is preferably employed for light shielding resin 7. For example, liquid crystal polymer, polyphenylene sulfide, polypthalamide resin (product name: Amodel (R)), or nylon may be used. From the standpoint of increasing the reflectance, white resin is preferably used for light shielding resin 7. Accordingly, the light from the gap of the lead frames arriving at the interface between transparent resin 4 and light shielding resin 7 is reflected to be eventually output within the directive angle of the semiconductor light emitting device. Thus, the light emitting efficiency of the semiconductor light emitting device is improved.

To summarize, the fabrication method of a semiconductor light emitting device according to the present embodiment includes the step (FIG. 3) of providing transparent resin 4 (light transmitting resin) through transfer molding (insert molding) to hold lead frame 1 (first and second lead frames) and constitute lens portion 4A on LED element 2 (semiconductor light emitting element) mounted on lead frame 10A, and the step (FIGS. 4 and 5) of providing light shielding resin 7 (resin with light blocking effect) surrounding the perimeter of LED element 2 using a mold 5 provided around LED element 2 and lens portion 4A.

A modification of the semiconductor light emitting device set forth above will be described hereinafter with reference to FIG. 6.

Figure 6:
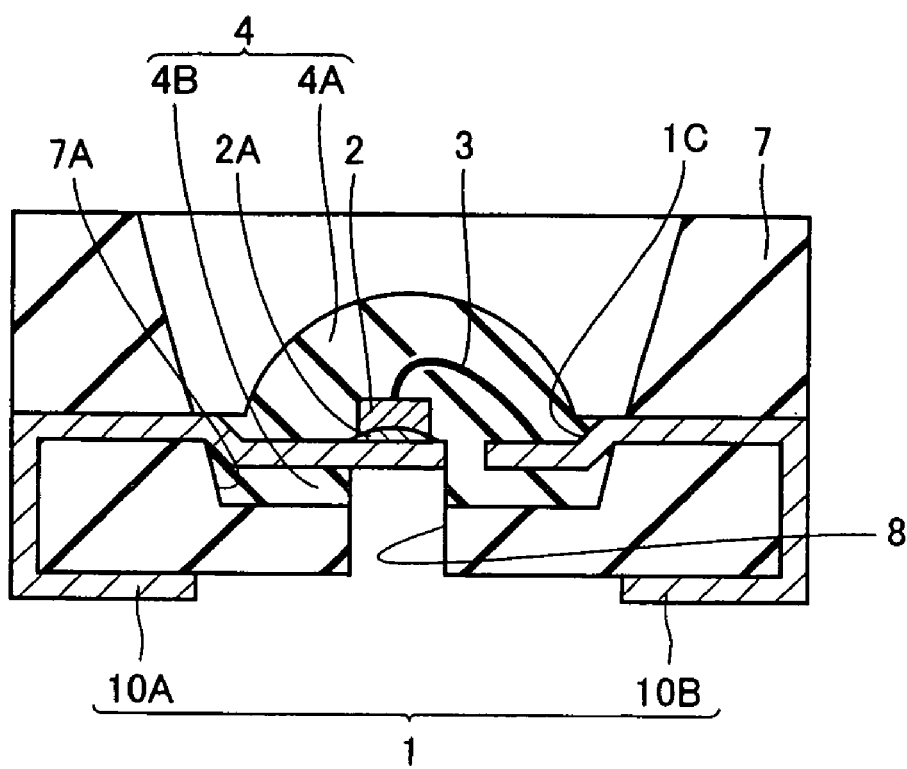
FIG. 6 is a sectional view of a modification of a semiconductor light emitting device according to an embodiment of the present invention.

In the modification of FIG. 6, a concave 8 is formed in resins 4B and 7 at the side opposite to the side of lead frame 10A corresponding to the region where LED element 2 is mounted. This relevant portion of lead frame 10A is exposed outside of transparent resin 4.

Accordingly, the heat generated from LED element 2 escapes easily outside (improved heat dissipation) and the light emitting efficiency is improved. Energy consumption of the light emitting element can be suppressed.

Furthermore, by filling a material of high heat conductivity such as silicon grease between the exposed region of lead frame 10A and a radiator (not shown), the heat dissipation characteristic can be further improved.

Although the description set forth above in FIGS. 5 and 6 is based on a structure in which only one LED element 2 is provided, a plurality of LED elements may be mounted on one semiconductor light emitting device. Furthermore, the configuration of lens portion 4A is not limited to a convex lens, and may be a concave lens. In the case of a concave lens, the directive angle of output light will become larger whereas the total luminous energy can be increased.

The reflector formed of light shielding resin 7 may take the configuration of an elliptic conical frustum instead of a bowl-like configuration (frustum of a cone). This provides anisotropic reflectance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting device comprising:
a semiconductor light emitting element,
a first lead frame on which said semiconductor light emitting element is mounted,
a second lead frame electrically connected to said semiconductor light emitting element via a wire, and
light transmitting resin formed on said semiconductor light emitting element and on said first and second lead frames,
wherein said light emitting element is surrounded by a light shielding resin,
wherein leading ends of said first and second lead frames are inserted into said light transmitting resin to provide a holding portion holding said first and second lead frames, wherein said light shielding resin has a reflectance higher than a reflectance of said light transmitting resin, and wherein said light shielding resin is formed to cover a bottom surface and a side surface of said holding portion provided in said light transmitting resin.

2. The semiconductor light emitting device according to claim 1, wherein said light transmitting resin comprises a lens portion constituting a lens on said semiconductor light emitting element, and wherein said lens portion has a width smaller than the width of said holding portion.

3. The semiconductor light emitting device according to claim 1, wherein a leading end of said first lead frame and a leading end of said second lead frame constitute a concave, said semiconductor light emitting element is provided on a bottom surface of said concave, and said holding portion receives at least a portion of said concave.

4. The semiconductor light emitting device according to claim 1, wherein said light transmitting resin comprises a lens portion constituting a lens on said semiconductor light emitting element, and wherein said semiconductor light emitting element is provided on an optical axis of said lens portion.

5. The semiconductor light emitting device according to claim 1, wherein a backside portion of said first lead frame corresponding to a region where said semiconductor light emitting element is mounted is exposed outside of said light transmitting resin.

6. The semiconductor light emitting device according to claim 1, wherein a material for scattering light is mixed into said light transmitting resin.

7. The semiconductor light emitting device according to claim 1, wherein said holding portion has a sectional shape of an upside-down trapezoid, and is received in a concave of said light shielding resin.

* * * * *